United States Patent
Liao et al.

(10) Patent No.: US 11,189,597 B2
(45) Date of Patent: Nov. 30, 2021

(54) CHIP ON FILM PACKAGE

(71) Applicant: Novatek Microelectronics Corp., Hsinchu (TW)

(72) Inventors: Chun-Yu Liao, Kaohsiung (TW); Teng-Jui Yu, Taoyuan (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/172,884

(22) Filed: Oct. 29, 2018

(65) Prior Publication Data
US 2020/0135695 A1  Apr. 30, 2020

(51) Int. Cl.
*H01L 25/065* (2006.01)
*H01L 23/498* (2006.01)
*H01L 23/00* (2006.01)
*H01L 23/538* (2006.01)

(52) U.S. Cl.
CPC ...... *H01L 25/0655* (2013.01); *H01L 23/4985* (2013.01); *H01L 23/5387* (2013.01); *H01L 24/17* (2013.01); *H01L 2224/17181* (2013.01)

(58) Field of Classification Search
CPC ............. H01L 23/5387; H01L 23/4985; H01L 2224/17181; H01L 25/0657; H01L 25/0652
See application file for complete search history.

(56) References Cited

U.S. PATENT DOCUMENTS

| 9,633,977 | B1* | 4/2017 | We | H01L 24/96 |
| 2008/0122088 | A1* | 5/2008 | Todd | H01L 25/50 |
| | | | | 257/741 |
| 2009/0324245 | A1* | 12/2009 | Fertig | G06F 1/04 |
| | | | | 398/155 |

FOREIGN PATENT DOCUMENTS

| CN | 106169462 | 11/2016 |
| JP | 2003007965 | 1/2003 |
| JP | 2007134448 | 5/2007 |

OTHER PUBLICATIONS

"Office Action of China Counterpart Application", dated Jan. 21, 2021, p. 1-p. 8.

* cited by examiner

*Primary Examiner* — Amar Mowa
(74) *Attorney, Agent, or Firm* — JCIPRNET

(57) ABSTRACT

A chip on film package including a flexible film, a first patterned circuit layer, one or more first chips, a second patterned circuit layer, and one or more second chips. The flexible film includes a first surface and a second surface opposite to the first surface. The first patterned circuit layer is disposed on the first surface. The one or more first chips are mounted on the first surface and electrically connected to the first patterned circuit layer. The second patterned circuit layer is disposed on the second surface. The one or more second chips are mounted on the second surface and electrically connected to the second patterned circuit layer.

17 Claims, 5 Drawing Sheets

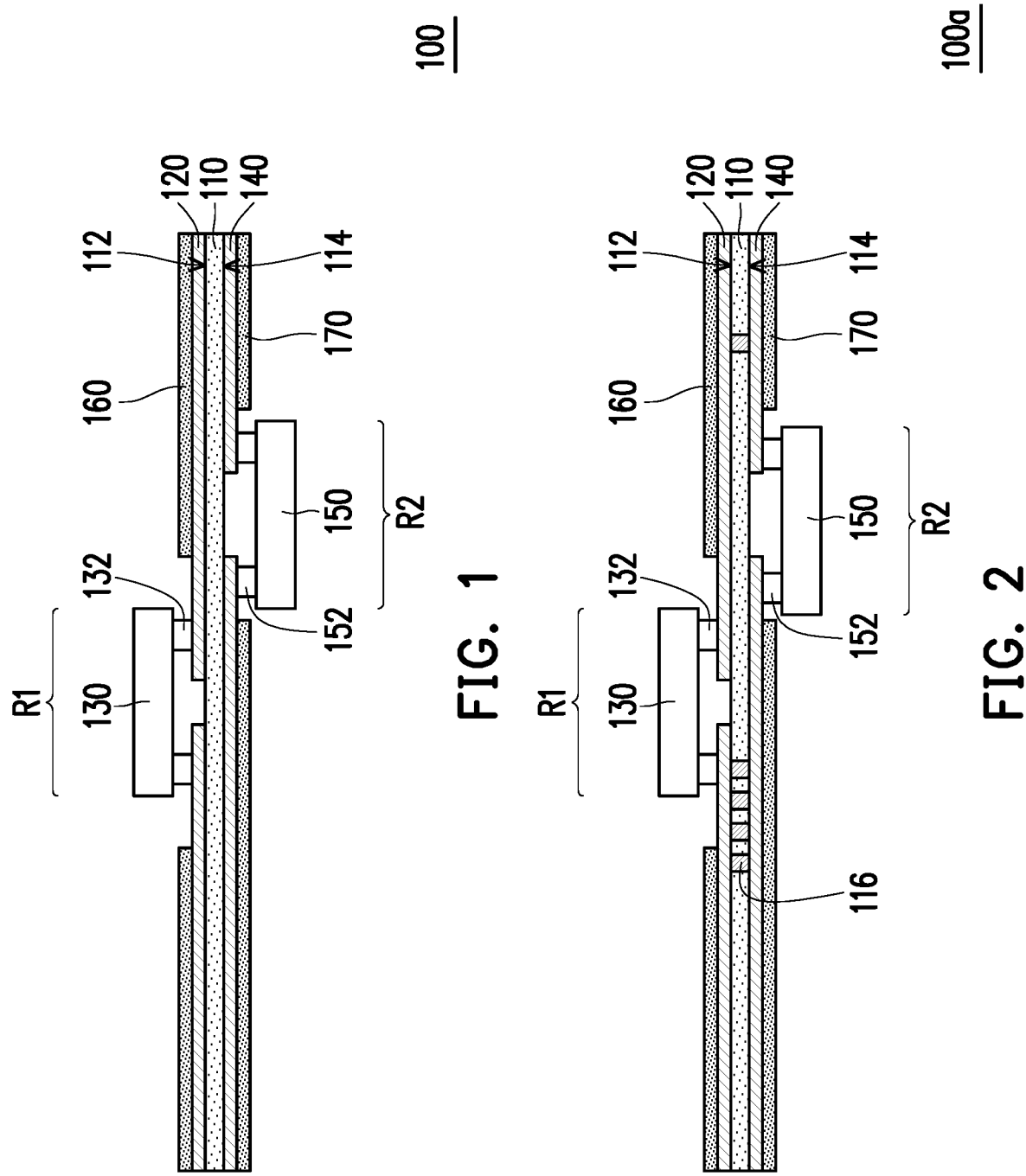

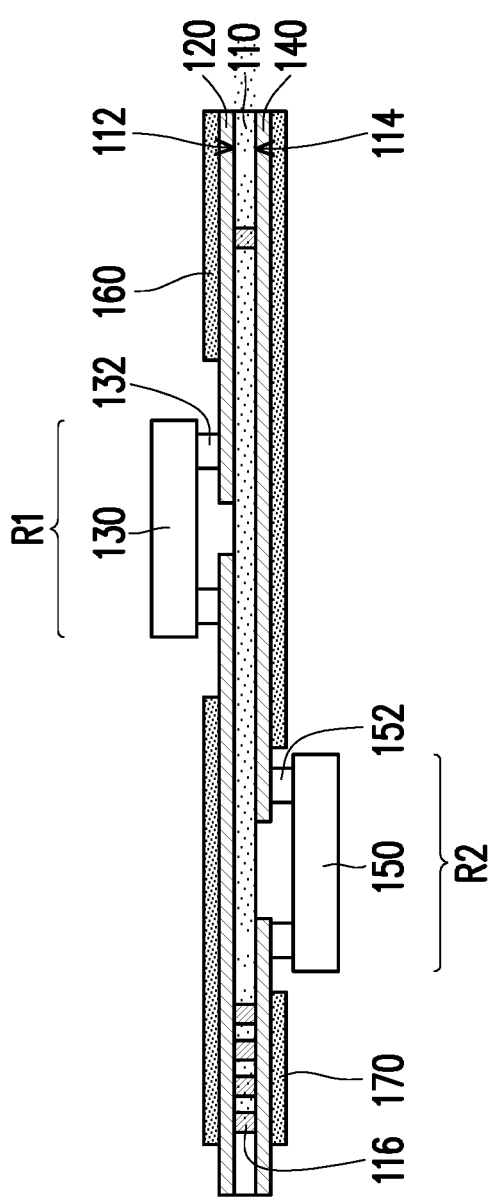
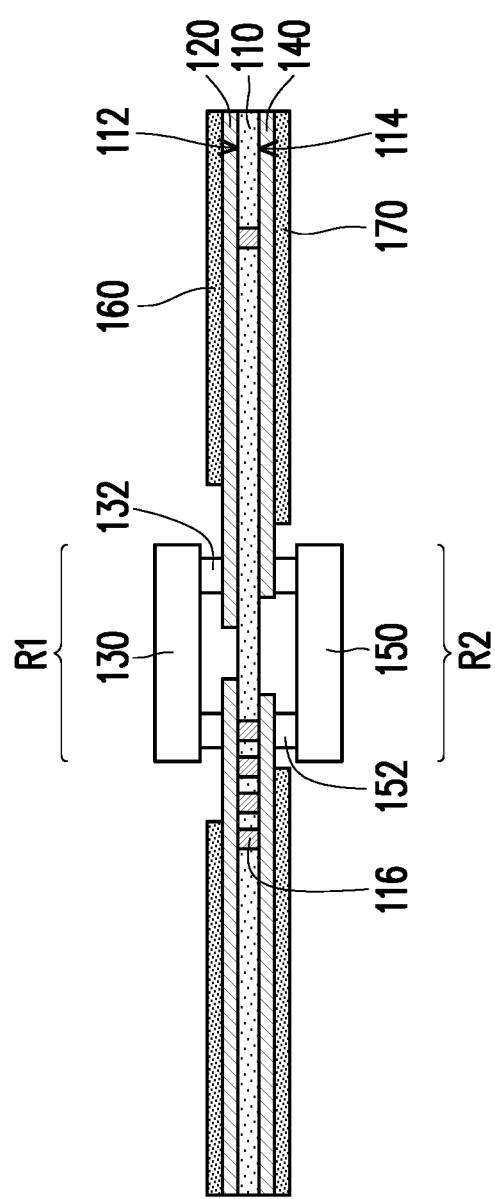
FIG. 3
FIG. 4

CHIP ON FILM PACKAGE

BACKGROUND

Technical Field

The present disclosure generally relates to chip package. More particularly, the present disclosure relates to chip on film package.

Description of Related Art

A chip on film (COF) semiconductor package may include a semiconductor chip mounted on a film substrate by using a flip-chip technique. The COF semiconductor package may be connected to an external circuit through input/output (I/O) pins connected to a metal pattern on the film substrate.

The COF substrate may include a base film on which the integrated circuit chip may be mounted, and conductive patterns may be arranged on the base film. Each of the conductive patterns may have a first end that is connected to the chip, and a second end that is connected to panel patterns of the display panel.

SUMMARY

Accordingly, the present disclosure is directed to a chip on film package which improves the space utilizing efficiency of the base film.

The present disclosure provides a chip on film package including a flexible film, a first patterned circuit layer, one or more first chips, a second patterned circuit layer, and one or more second chips. The flexible film includes a first surface and a second surface opposite to the first surface. The first patterned circuit layer is disposed on the first surface. The one or more first chips are mounted on the first surface and electrically connected to the first patterned circuit layer. The second patterned circuit layer is disposed on the second surface. The one or more second chips are mounted on the second surface and electrically connected to the second patterned circuit layer.

According to an embodiment of the present disclosure, the one or more first chips are mounted on a first mounting region of the first surface, the one or more second chips are mounted on a second mounting region of the second surface, and the first mounting region is overlapped with the second mounting region from a top view.

According to an embodiment of the present disclosure, at least one of the one or more second chips are located right under at least one of the one or more first chips.

According to an embodiment of the present disclosure, the one or more first chips are mounted on a first mounting region of the first surface, the one or more second chips are mounted on a second mounting region of the second surface, and the first mounting region is not overlapped with the second mounting region from a top view.

According to an embodiment of the present disclosure, the flexible film further comprises one or more vias electrically connecting the first patterned circuit layer and the second patterned circuit layer.

According to an embodiment of the present disclosure, the chip on film package further includes a first solder resist layer disposed on the first patterned circuit layer and exposing a part of the first patterned circuit layer where the one or more first chips are mounted.

According to an embodiment of the present disclosure, the chip on film package further includes a second solder resist layer disposed on the second patterned circuit layer and exposing a part of the second patterned circuit layer where the one or more second chips are mounted.

According to an embodiment of the present disclosure, a number of the one or more first chips are plural.

According to an embodiment of the present disclosure, the first chips are mounted on the first surface in a side-by-side manner.

According to an embodiment of the present disclosure, a number of the one or more second chips are plural.

According to an embodiment of the present disclosure, the second chips are mounted on the second surface in a side-by-side manner.

According to an embodiment of the present disclosure, the chip on film package further includes a substrate connected to a peripheral region of the flexible film and electrically connected to the first patterned circuit layer and/or the second patterned circuit layer.

According to an embodiment of the present disclosure, the substrate comprises a glass substrate or a printed circuit board.

According to an embodiment of the present disclosure, the flexible film further comprises a plurality of vias electrically connecting the first patterned circuit layer and the second patterned circuit layer.

According to an embodiment of the present disclosure, the chip on film package further includes a first substrate connected to a peripheral region of the first surface and a second substrate connected to a peripheral region of the second surface, wherein the first substrate is electrically connected to the first patterned circuit layer and the second substrate is electrically connected to the second patterned circuit layer.

In light of the foregoing, in the chip on film package of the disclosure, the chips are mounted on two opposite surfaces of the flexible film so as to increase usage of space on both sides of the flexible film, and thereby space utilizing efficiency of the chip on film package can be improved. In addition, with the arrangement of the vias for electrically connecting the patterned circuit layer on the two opposite surfaces of the flexible film, the design flexibility of the chip on film package can be significantly improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1 illustrates a cross sectional view of a chip on film package according to an embodiments of the disclosure.

FIG. 2 illustrates a cross sectional view of a chip on film package according to an embodiments of the disclosure.

FIG. 3 illustrates a cross sectional view of a chip on film package according to an embodiments of the disclosure.

FIG. 4 illustrates a cross sectional view of a chip on film package according to an embodiments of the disclosure.

DESCRIPTION OF THE EMBODIMENTS

Figure 5:
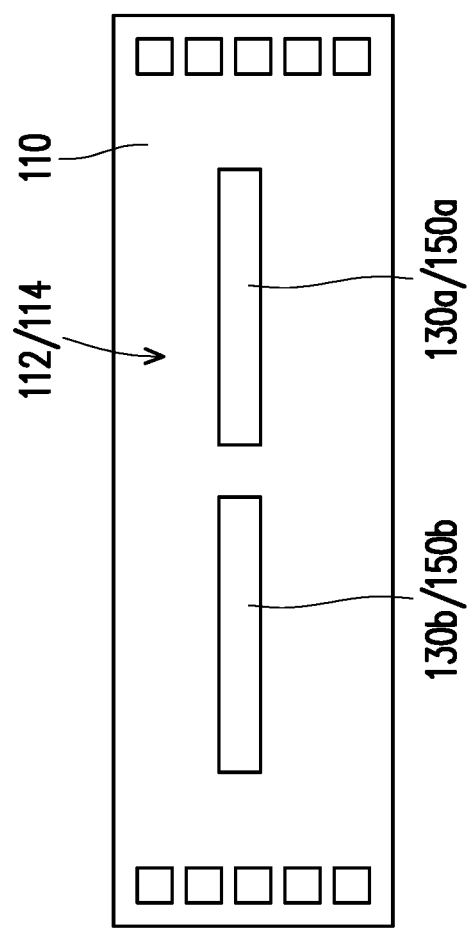
FIG. 5 illustrates a top view of a chip on film package according to an embodiments of the disclosure.

Reference will now be made in detail to the present preferred embodiments of the disclosure, examples of which are illustrated in the accompanying drawings. Wherever possible, the same reference numbers are used in the drawings and the description to refer to the same or like parts. The terms used herein such as "on", "above", "below", "front", "back", "left" and "right" are for the purpose of describing directions in the figures only and are not intended to be limiting of the disclosure. Further, in the discussion and claims herein, the term "on" used with respect to two materials, one "on" the other, means at least some contact between the materials, while "over" and "overlie" mean the materials are in proximity, but possibly with one or more additional intervening materials such that physical contact is possible but not required. Neither "on" nor "over" implies any directionality as used herein.

Unless limited otherwise, the terms "disposed", "connected", "coupled", "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Accordingly, the drawings and descriptions will be regarded as illustrative in nature and not as restrictive.

Figure 8:
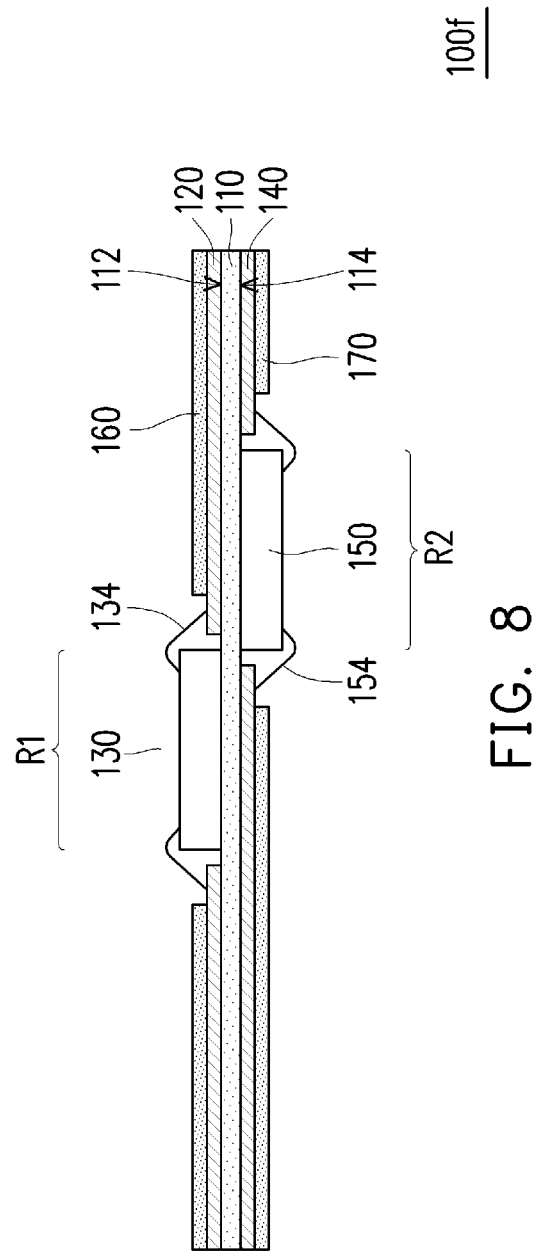
FIG. 8 illustrates a cross sectional view of a chip on film package according to an embodiments of the disclosure.

FIG. 1 illustrates a cross sectional view of a chip on film package according to an embodiments of the disclosure. Referring to FIG. 1, in some embodiments, a chip on film package 100 includes a flexible film 110, a first patterned circuit layer 120, one or more first chips 130 (one is illustrated, but not limited to, herein), a second patterned circuit layer 140, and one or more second chips 150 (one is illustrated, but not limited to, herein). The flexible film 110 may include a flexible and insulating material. The chips 130/150 mounted thereon may function to drive a semiconductor device, a display device (i.e., the chip 130/150 may be a display driver), etc. The flexible film 110 includes a first surface 112 and a second surface 114 opposite to the first surface 112. The first patterned circuit layer 120 is disposed on the first surface 112. The first chip 130 is mounted on the first surface 112 and electrically connected to the first patterned circuit layer 120. In some embodiments, the first chip 130 is mounted on the first patterned circuit layer 120 on the first surface 112 via a plurality of conductive bumps 132 by, for example, a flip chip bonding technique. In other embodiments, as it is shown in FIG. 8, the first chip 130 may be mounted on the first surface 112 and is electrically connected to the first patterned circuit layer 120 through a plurality of wires 134 by, for example, a wire bonding technique. The second patterned circuit layer 140 is disposed on the second surface 114. The second chip 150 is mounted on the second surface 114 and electrically connected to the second patterned circuit layer 140. In some embodiments, the second chip 150 is mounted on the second patterned circuit layer 140 on the second surface 114 via a plurality of conductive bumps 152 by, for example, a flip chip bonding technique. In other embodiments, as it is shown in FIG. 8, the second chip 150 may be mounted on the second surface 114 and is electrically connected to the second patterned circuit layer 140 through a plurality of wires 154 by, for example, a wire bonding technique. The disclosure does not limit the way of the chips 130, 150 mounted on the flexible film 110 and electrically connected to the patterned circuit layers 120, 140.

In some embodiments, the first chip 130 is mounted on a first mounting region R1 of the first surface 112, and the second chip 150 is mounted on a second mounting region R2 of the second surface 114. The first mounting region R1 is overlapped with the second mounting region R2 from a top view as it is shown in FIG. 1. In other words, the first mounting region R1 where the first mounting region R1 and the second mounting region R2 where the second chip 150 is mounted are not completely staggered but rather partially overlapped from a top view. In the present embodiment, the first chip 130 and the second chip 150 may be electrically insulated from each other. Namely, the first patterned circuit layer 120 and the second patterned circuit layer 140 are electrically insulated from each other, but the disclosure is not limited thereto.

In some embodiments, the chip on film package 100 further includes a first solder resist layer 160, which is disposed on the first patterned circuit layer 120 and exposes a part of the first patterned circuit layer 120 where the first chip 130 is mounted. In other words, the first solder resist layer 160 is disposed on the first patterned circuit layer 120 and exposes the first mounting region R1 of the flexible film 110. Similarly, the chip on film package 100 may further include a second solder resist layer 170, which is disposed on the second patterned circuit layer 140 and exposes a part of the second patterned circuit layer 140 where the second chip 150 is mounted. In other words, the second solder resist layer 170 is disposed on the second patterned circuit layer 140 and exposes the second mounting region R2 of the flexible film 110.

FIG. 2 illustrates a cross sectional view of a chip on film package according to an embodiments of the disclosure. It is noted that the chip on film package 100a shown in FIG. 2 contains many features same as or similar to the chip on film package 100 disclosed earlier with FIG. 1. For purpose of clarity and simplicity, detail description of same or similar features may be omitted, and the same or similar reference numbers denote the same or like components. The main differences between the chip on film package 100a shown in FIG. 2 and the chip on film package 100 shown in FIG. 1 are described as follows.

Referring to FIG. 2, in some embodiments, the flexible film 110 may further include one or more vias 116, which are electrically connecting the first patterned circuit layer 120 and the second patterned circuit layer 140. In other words, in the present embodiment, the first patterned circuit layer 120 and the second patterned circuit layer 140 are electrically connected to each other by the vias 116. Accordingly, the first chip 130 is electrically connected to the second chip 150.

FIG. 3 illustrates a cross sectional view of a chip on film package according to an embodiments of the disclosure. It is noted that the chip on film package 100b shown in FIG. 3 contains many features same as or similar to the chip on film package 100 disclosed earlier with FIG. 1. For purpose of clarity and simplicity, detail description of same or similar features may be omitted, and the same or similar reference numbers denote the same or like components. The main differences between the chip on film package 100b shown in FIG. 3 and the chip on film package 100 shown in FIG. 1 are described as follows.

Referring to FIG. 3, in some embodiments, the first mounting region R1 is not overlapped with the second mounting region R2 from a top view as it is shown in FIG.

3. In other words, the first mounting region R1 where the first mounting region R1 and the second mounting region R2 where the second chip 150 is mounted are completely staggered from a top view, so as to avoid the bonding force applied by the flip chip bonding technique damaging the chip 130/150 on the opposite side.

FIG. 4 illustrates a cross sectional view of a chip on film package according to an embodiments of the disclosure. It is noted that the chip on film package 100c shown in FIG. 4 contains many features same as or similar to the chip on film package 100b disclosed earlier with FIG. 3. For purpose of clarity and simplicity, detail description of same or similar features may be omitted, and the same or similar reference numbers denote the same or like components. The main differences between the chip on film package 100c shown in FIG. 4 and the chip on film package 100b shown in FIG. 3 are described as follows.

Referring to FIG. 4, in some embodiments, the second chip 150 is located right under the first chip 130. That is to say, the second chip 150 is aligned with the first chip 130 from a top view. In other words, the first mounting region R1 where the first chip 130 is mounted is completely overlapped with the second mounting region R2 where the second chip 150 is mounted from a top view as it is shown in FIG. 4. In an embodiment of multiple first chips 130 and multiple second chips 150 mounted on the flexible film 110, at least one of the second chips 150 is located right under at least one of the first chips 130. In some embodiments, a carrier with at least one cavity for receiving at least one first chip 130 is provided. Then, the flexible film 110 with the first chip 130 mounted on the first surface 112 can be disposed on the carrier with the second surface 114 facing up, so that the first chip 130 mounted on the first surface 112 can be received in the cavity of the carrier. Then, the second chip 150 can be mounted on the second surface 114 by, for example, flip chip bonding technique without damaging the first chip 130. The mounting process can applied to other chip on film packages (e.g. chip on film packages 100, 100a, 100b, etc.) as well.

FIG. 5 illustrates a top view of a chip on film package according to an embodiments of the disclosure. In some embodiments, a number of the first chips 130 are plural, and the first chips 130 are mounted on the first surface 112 of the flexible film 110 in a side-by-side manner. In some embodiments, a number of the second chips 150 are plural, and the second chips 150 are mounted on the second surface 114 of the flexible film 110 in a side-by-side manner. In some embodiments, the second chips 150 can be disposed right under the first chips 130 respectively. Namely, the second chips 150 are aligned with the first chips 130 respectively from a top view. In other embodiments, the first mounting regions R1 where the first chips 130 are mounted are overlapped with the second mounting regions R2 where the second chips 150 are mounted from a top view. The disclosure does not limit the numbers and the dispositions of the first chip(s) and the second chip(s) 150.

Figure 6:
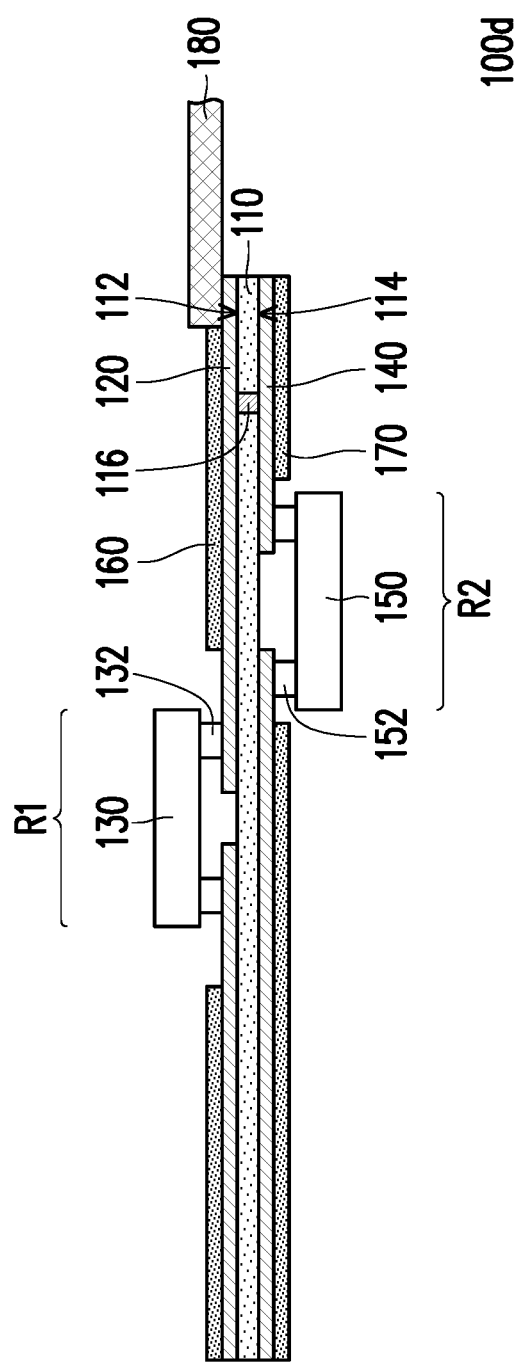
FIG. 6 illustrates a cross sectional view of a chip on film package according to an embodiments of the disclosure.

FIG. 6 illustrates a cross sectional view of a chip on film package according to an embodiments of the disclosure. It is noted that the chip on film package 100d shown in FIG. 6 contains many features same as or similar to the chip on film package 100 disclosed earlier with FIG. 1. For purpose of clarity and simplicity, detail description of same or similar features may be omitted, and the same or similar reference numbers denote the same or like components. The main differences between the chip on film package 100d shown in FIG. 6 and the chip on film package 100 shown in FIG. 1 are described as follows.

In some embodiments, the chip on film package 100d may further include a substrate 180, which is connected to a peripheral region of the flexible film 110. The substrate 180 is electrically connected to the first patterned circuit layer 120. In some embodiments, the substrate 180 may be electrically insulated from the second patterned circuit layer 140. Alternatively, the substrate 180 may be electrically connected to both of the first patterned circuit layer 120 and the second patterned circuit layer. In the present embodiment, the flexible film 110 further includes a plurality of vias 116 penetrating the flexible film 110 for electrically connecting the first patterned circuit layer 120 and the second patterned circuit layer 140. Accordingly, the substrate 180 is connected to the first patterned circuit layer 120, and is electrically connected to the second patterned circuit layer through the vias 116. In some embodiments, the substrate 180 may be a glass substrate, a printed circuit board or any other suitable substrate.

Figure 7:
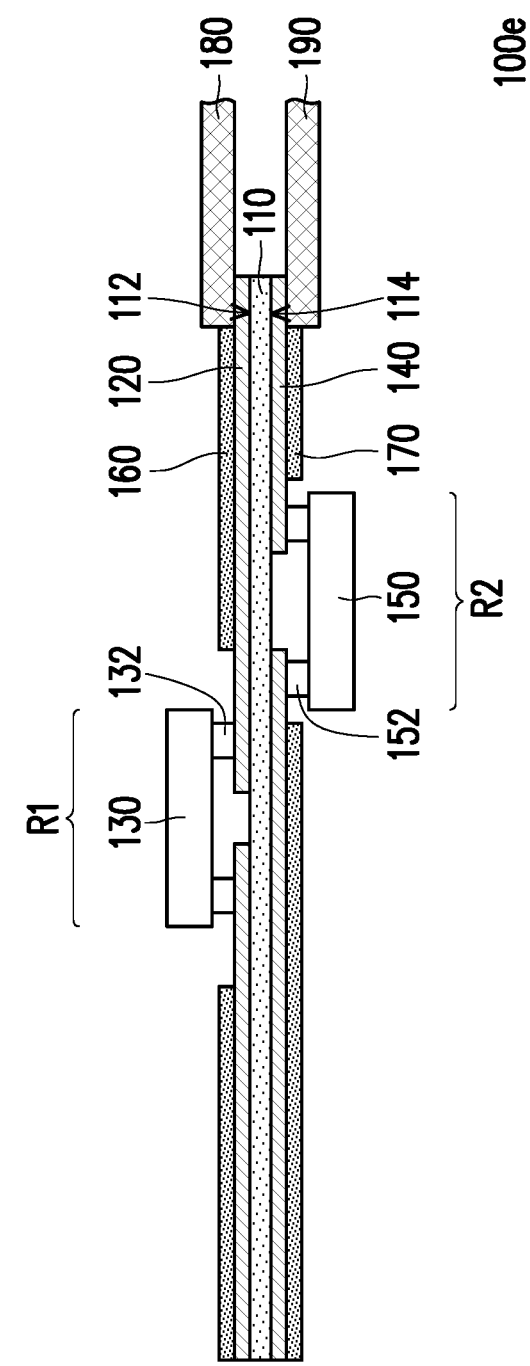
FIG. 7 illustrates a cross sectional view of a chip on film package according to an embodiments of the disclosure.

FIG. 7 illustrates a cross sectional view of a chip on film package according to an embodiments of the disclosure. It is noted that the chip on film package 100e shown in FIG. 7 contains many features same as or similar to the chip on film package 100 disclosed earlier with FIG. 1. For purpose of clarity and simplicity, detail description of same or similar features may be omitted, and the same or similar reference numbers denote the same or like components. The main differences between the chip on film package 100e shown in FIG. 7 and the chip on film package 100 shown in FIG. 1 are described as follows.

In some embodiments, the chip on film package 100e may further include a first substrate 180 and a second substrate 190. The first substrate 180 is connected to a peripheral region of the first surface 112 and the second substrate 190 is connected to a peripheral region of the second surface 114. The first substrate 180 is electrically connected to the first patterned circuit layer 120, and the second substrate 190 is electrically connected to the second patterned circuit layer 140. In some embodiments, the first substrate 180 may be electrically insulated from the second substrate 190. Alternatively, the substrate 180 may be electrically connected to the second substrate 190 through at least one vias (e.g. the vias 116 illustrated in FIG. 6). In some embodiments, the first substrate 180 and the second substrate 190 may be glass substrates, printed circuit boards or combination thereof.

In sum, according to the embodiments of the chip on film package of the disclosure, the chips can be mounted on two opposite surfaces of the flexible film. This can increase usage of space on both sides of the flexible film, and thereby space utilizing efficiency of the chip on film package can be improved. In addition, according to some embodiments, with the arrangement of the vias for electrically connecting the patterned circuit layer on the two opposite surfaces of the flexible film, the design flexibility of the chip on film package can be significantly improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip on film package, comprising:
   a flexible film comprising a first surface and a second surface opposite to the first surface;
   a first patterned circuit layer disposed on and in direct contact with the first surface;

one or more first chips mounted on the first surface and electrically connected to the first patterned circuit layer;
a second patterned circuit layer disposed on and in direct contact with the second surface;
one or more second chips mounted on the second surface and electrically connected to the second patterned circuit layer;
a solder resist layer disposed on the second patterned circuit layer and exposing a part of the flexible film over one of the one or more second chips and exposing a part of the second patterned circuit layer where the one or more second chips are mounted; and
a substrate separated from and bonded to a peripheral region of the flexible film, wherein the substrate is bonded on the same level with the one or more first chips and/or the one or more second chips.

2. The chip on film package as claimed in claim 1, wherein the one or more first chips are mounted on a first mounting region of the first surface, the one or more second chips are mounted on a second mounting region of the second surface, and the first mounting region is overlapped with the second mounting region from a top view.

3. The chip on film package as claimed in claim 1, wherein at least one of the one or more second chips are located right under at least one of the one or more first chips.

4. The chip on film package as claimed in claim 1, wherein the one or more first chips are mounted on a first mounting region of the first surface, the one or more second chips are mounted on a second mounting region of the second surface, and the first mounting region is not overlapped with the second mounting region from a top view.

5. The chip on film package as claimed in claim 1, further comprising a first solder resist layer disposed on the first patterned circuit layer and exposing a part of the first patterned circuit layer where the one or more first chips are mounted.

6. The chip on film package as claimed in claim 1, further comprising a second solder resist layer disposed on the second patterned circuit layer and exposing a part of the second patterned circuit layer where the one or more second chips are mounted.

7. The chip on film package as claimed in claim 1, wherein a number of the one or more first chips are plural.

8. The chip on film package as claimed in claim 7, wherein the first chips are mounted on the first surface in a side-by-side manner.

9. The chip on film package as claimed in claim 1, wherein a number of the one or more second chips are plural.

10. The chip on film package as claimed in claim 9, wherein the second chips are mounted on the second surface in a side-by-side manner.

11. The chip on film package as claimed in claim 1, wherein the substrate is electrically connected to the first patterned circuit layer and/or the second patterned circuit layer.

12. The chip on film package as claimed in claim 11, wherein the substrate comprises a glass substrate.

13. The chip on film package as claimed in claim 1, further comprising a first substrate connected to a peripheral region of the first surface and a second substrate connected to a peripheral region of the second surface, wherein the first substrate is electrically connected to the first patterned circuit layer and the second substrate is electrically connected to the second patterned circuit layer.

14. The chip on film package as claimed in claim 1, wherein the first chip is mounted on the first patterned circuit layer on the first surface via a plurality of first conductive bumps, and the second chip is mounted on the second patterned circuit layer on the second surface via a plurality of second conductive bumps.

15. The chip on film package as claimed in claim 1, wherein the first chip is mounted on the first surface and is electrically connected to the first patterned circuit layer through a plurality of first wires, and the second chip is mounted on the second surface and is electrically connected to the second patterned circuit layer through a plurality of second wires.

16. A chip on film package, comprising:
a flexible film comprising a first surface and a second surface opposite to the first surface;
a first patterned circuit layer disposed on the first surface;
one or more first chips mounted on the first surface and electrically connected to the first patterned circuit layer;
a second patterned circuit layer disposed on the second surface;
one or more second chips mounted on the second surface and electrically connected to the second patterned circuit layer; and
a substrate disposed on and connected to a peripheral region of the flexible film and electrically connected to the first patterned circuit layer and/or the second patterned circuit layer, wherein the substrate comprises an extension portion, and in a normal direction perpendicular to the first surface or the second surface, the extension portion does not extend on the flexible film or any interconnect.

17. The chip on film package as claimed in claim 16, wherein the substrate comprises a glass substrate.

* * * * *